United States Patent
Pikus et al.

(10) Patent No.: US 9,940,428 B2
(45) Date of Patent: Apr. 10, 2018

(54) HIERARCHICAL FILL IN A DESIGN LAYOUT

(71) Applicant: Mentor Graphics Corporation, Wilsonville, OR (US)

(72) Inventors: Fedor Pikus, Beaverton, OR (US); Jimmy Jason Tomblin, Portland, OR (US); William S. Graupp, Aurora, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 56 days.

(21) Appl. No.: 14/508,825

(22) Filed: Oct. 7, 2014

(65) Prior Publication Data

US 2016/0098512 A1    Apr. 7, 2016

(51) Int. Cl.
*G06F 17/50* (2006.01)

(52) U.S. Cl.
CPC ...... *G06F 17/5081* (2013.01); *G06F 17/5072* (2013.01); *G06F 17/504* (2013.01); *G06F 17/5068* (2013.01)

(58) Field of Classification Search
None
See application file for complete search history.

(56) References Cited

U.S. PATENT DOCUMENTS

| | | | | |
|---|---|---|---|---|
| 5,636,133 A * | 6/1997 | Chesebro | ............ | G06F 17/5081 345/441 |
| 5,671,152 A * | 9/1997 | Lavin | ............ | G06F 17/5068 716/119 |
| 6,189,130 B1 * | 2/2001 | Gofman | ............ | G06F 17/5081 716/55 |
| 6,756,242 B1 * | 6/2004 | Regan | ............ | G06F 17/5081 438/14 |
| 7,124,386 B2 * | 10/2006 | Smith | ............ | G06F 17/5068 257/E21.304 |
| 7,143,367 B2 * | 11/2006 | Eng | ............ | G06F 17/5045 716/102 |
| 7,216,331 B2 * | 5/2007 | Wu | ............ | G03F 1/30 430/311 |
| 7,343,580 B2 * | 3/2008 | Zorrilla | ............ | G06F 17/5036 716/112 |
| 7,356,783 B2 * | 4/2008 | Smith | ............ | G06F 17/5068 257/E21.244 |
| 7,383,521 B2 * | 6/2008 | Smith | ............ | G06F 17/5068 716/114 |

(Continued)

OTHER PUBLICATIONS

Y. Chen et al., "Hierarchical Dummy Fill for Process Uniformity," 2001 IEEE, pp. 139-144.*

*Primary Examiner* — Leigh Garbowski
(74) *Attorney, Agent, or Firm* — Mentor Graphics Corporation

(57) ABSTRACT

This application discloses a computing system implementing one or more tools or mechanism configured to capture a hierarchy of a circuit design layout generated by a downstream tool. The hierarchy can include multiple cells that identify corresponding portions of the circuit design layout. The tools or mechanism can be further configured to modify the circuit design layout based, at least in part, on the captured hierarchy, which alters the portions of the circuit design layout identified by the cells separately from other portions of the circuit design layout.

18 Claims, 8 Drawing Sheets

(56) References Cited

U.S. PATENT DOCUMENTS

| | | | | |
|---|---|---|---|---|
| 7,523,429 B2* | 4/2009 | Kroyan | ............... | G06F 17/5068 |
| | | | | 716/119 |
| 7,565,638 B2* | 7/2009 | Hoerold | .............. | G06F 17/5081 |
| | | | | 716/106 |
| 7,647,569 B2* | 1/2010 | Chen | ................... | G06F 17/5081 |
| | | | | 716/104 |
| 7,757,195 B2* | 7/2010 | Smith | ................. | G06F 17/5068 |
| | | | | 257/E21.523 |
| 7,774,726 B2* | 8/2010 | White | ................ | G06F 17/5068 |
| | | | | 716/122 |
| 7,793,238 B1* | 9/2010 | Rabkin | .............. | G06F 17/5081 |
| | | | | 703/1 |
| 7,966,594 B2* | 6/2011 | Zorrilla | .............. | G06F 17/5036 |
| | | | | 716/110 |
| 8,510,685 B1* | 8/2013 | Rossman | ........... | G06F 17/5068 |
| | | | | 716/50 |
| 8,539,416 B1* | 9/2013 | Rossman | ........... | G06F 17/5081 |
| | | | | 716/118 |
| 8,555,212 B2* | 10/2013 | Sawicki | ............. | G06F 17/5045 |
| | | | | 716/100 |
| 9,330,224 B2* | 5/2016 | Ding | ................... | G06F 17/5081 |
| 2013/0019219 A1* | 1/2013 | Chen | .................. | G06F 17/5068 |
| | | | | 716/111 |

\* cited by examiner

EXAMPLE CELL HIERARCHY

HIERARCHICAL FILL IN A DESIGN LAYOUT

TECHNICAL FIELD

This application discloses various techniques and tools to assist in the design of a circuit device, such as an integrated circuit design, particularly providing structures to fill open spaces on the surfaces of layers in a circuit device.

BACKGROUND

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit, its complexity, the design team, and the microcircuit fabricator or foundry that will manufacture the microcircuit. Software and hardware "tools" then verify the design at various stages of the design flow by running software simulators and/or hardware emulators, and errors in the design are corrected.

Several steps are common to most design flows. First, the specifications for the new microcircuit are described in terms of logical operations, typically using a Hardware Design Language (HDL), such as the Very high speed integrated circuit Hardware Design Language (VHDL). After the accuracy of the logical design is confirmed, the logical design is converted into device design data by synthesis software. The device design data, in the form of a schematic, represents the specific electronic devices, such as transistors, resistors, and capacitors, which will achieve the desired logical result and their interconnections. Preliminary timing estimates for portions of the circuit may also be made at this stage, using an assumed characteristic speed for each device. This schematic generally corresponds to the level of representation displayed in conventional circuit diagrams.

Once the relationships between circuit devices have been established, the design is again transformed into physical design data describing specific geometric elements, often referred to as a "layout" design. These geometric elements (typically polygons) define the shapes that will be created in various materials to form the specified circuit devices. Custom layout editors, such as Mentor Graphics' IC Station or Cadence's Virtuoso, are commonly used for this task. Automated place and route tools also will frequently be used to define the physical layouts, especially the placement of wires that will be used to interconnect the circuit devices. Each layer of the microcircuit will have a corresponding layer representation in the layout design, and the geometric shapes described in a layer representation will define the relative locations of the circuit elements that will make up the circuit device. For example, the shapes in the representation of an implant layer will define the regions where doping will occur, while the shapes in the representation of a metal layer will define the locations of metal wires used to connect the circuit devices. Thus, the layout design data represents the patterns that may be written onto masks used to fabricate the desired microcircuit during a photolithographic process.

Modern integrated circuits typically will be formed of multiple layers of material, such as metal, diffusion material, and polysilicon. During the manufacturing process, layers of material are formed on top of one another sequentially. After each layer is created, portions of the layer are removed to create circuit element structures. Together, the circuit element structures form the operational circuit devices which make up the integrated circuit, such as transistors, capacitors and resistors. Before a new layer is formed over the circuit element structures in an existing layer, however, the existing layer must be polished to ensure planarity. Polishing, using any of various types of polishing processes, is sometimes generically referred to as "planarization."

One problem with conventional planarization methods is that different materials will have different densities, so softer materials will be polished more than harder materials. As a result, a layer's surface may become uneven, causing the next layer to have an uneven surface as well. If this occurs, upper (i.e., subsequently formed) layers of material will have a very irregular surface topography. Such irregular surface topographies may cause a variety of flaws in a circuit device, such as holes, loss of contact, and other defects.

To improve the planarity of a layer of material, the integrated circuit designer (or manufacturer) often will analyze the layout circuit design for the layer to identify empty regions. For example, the designer or manufacturer may analyze the design of the layer to determine the density of the functional structures that will be formed in the layer. That is, the designer or manufacturer may determine the density of "functional" geometric elements (i.e., those geometric elements in the layout design data that represent functional structures that will be manufactured from the design data in the integrated circuit device) and identify regions that are empty of these functional geometric elements. The designer or manufacturer will then modify the layout circuit design to fill these empty regions with data representing "dummy" or "fill" geometric elements. That is, the designer or manufacturer will modify a design to increase the density of structures that will be formed in the layer. When the circuit is manufactured, these "dummy" or "fill" structures will be formed alongside the "functional" circuit element structures, so that the overall surface of the layer is more consistently flat.

This type of corrective technique may be implemented using one or more fill tools, which, for example, can be a software application for identifying and manipulating structures defined in a layout circuit design, such as one or more tools in the CALIBRE® family of software tools available from Mentor Graphics® Corporation of Wilsonville, Oreg. These fill tools typically perform this corrective technique by dividing the layout circuit design, for example, by generating multiple non-overlapping windows corresponding to different portions of the layout circuit design, and separately filling each portion of the layout circuit design defined by a corresponding window with data representing "dummy" or "fill" geometric elements. Since the fill tool generates these windows without consideration of the underlying architecture of the layout circuit design, in most cases, the corrective technique eliminates any geometric redundancy in the original layout circuit design. Consequently, in subsequent electronic design processes, such as design rule checking, the ability to leverage any geometric redundancy present in layout circuit design is also eliminated by the fill process. Thus, while the corrective technique can help generate an improved manufactured circuit, it comes at the cost of additional design time to perform any design rule checking or other processing, such as optical proximity correction that could have previously leveraged geometric redundancy in the layout circuit design.

SUMMARY

Previous design flows perform modifications or enhancements to a circuit design layout, such as fill operations, via placement, and/or wire optimization, prior to performing certain downstream checks and/or analysis, such as design rule checking, optical proximity correction, or the like. Since the modifications or enhancements to the circuit design layout in these conventional design flows had a tendency to destroy redundancy inherent in that circuit design layout, the downstream checks and/or analysis could not leverage this redundancy in their processing, which consumed an increased amount of time in the design flows. This application discloses a computing system implementing one or more tools or mechanism configured to identify design features in the circuit design layout that, if retained, could save time on back-end processing and then to perform front-end modification while attempting to retain those identified design features.

In some embodiments, the tools or mechanism can capture a hierarchy of a circuit design layout generated by a downstream tool. The hierarchy can include multiple cells that identify respective portions of the circuit design layout. The tools or mechanism can be further configured to modify the circuit design layout based, at least in part, on the captured hierarchy, which alters the portions of the circuit design layout identified by the cells separately from other portions of the circuit design layout. The modified circuit design layout can have a hierarchy substantially similar to the captured hierarchy of the circuit design layout. In some embodiments, the tools or mechanism can modify the circuit design layout by performing fill operations on the portions of the circuit design layout identified by the cells, performing fill operations on the other portions of the circuit design layout, and merging the filled portions and filled other portions of the circuit design layout into the captured hierarchy. These and other embodiments will be described below in greater detail.

DETAILED DESCRIPTION

Illustrative Operating Environment

The execution of various design processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some processes and the large size of many designs, various tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

Figure 1:
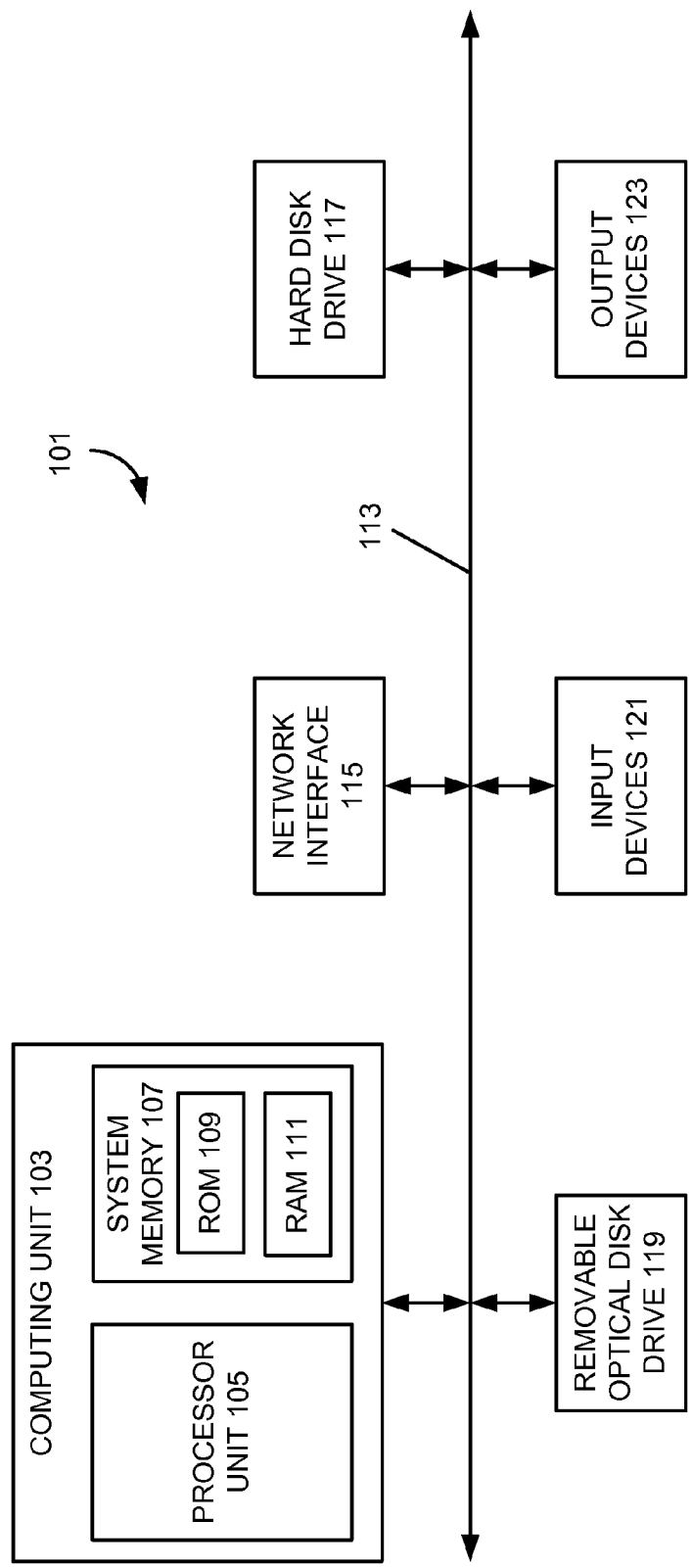
FIGS. 1 and 2 illustrate an example of a computer system of the type that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
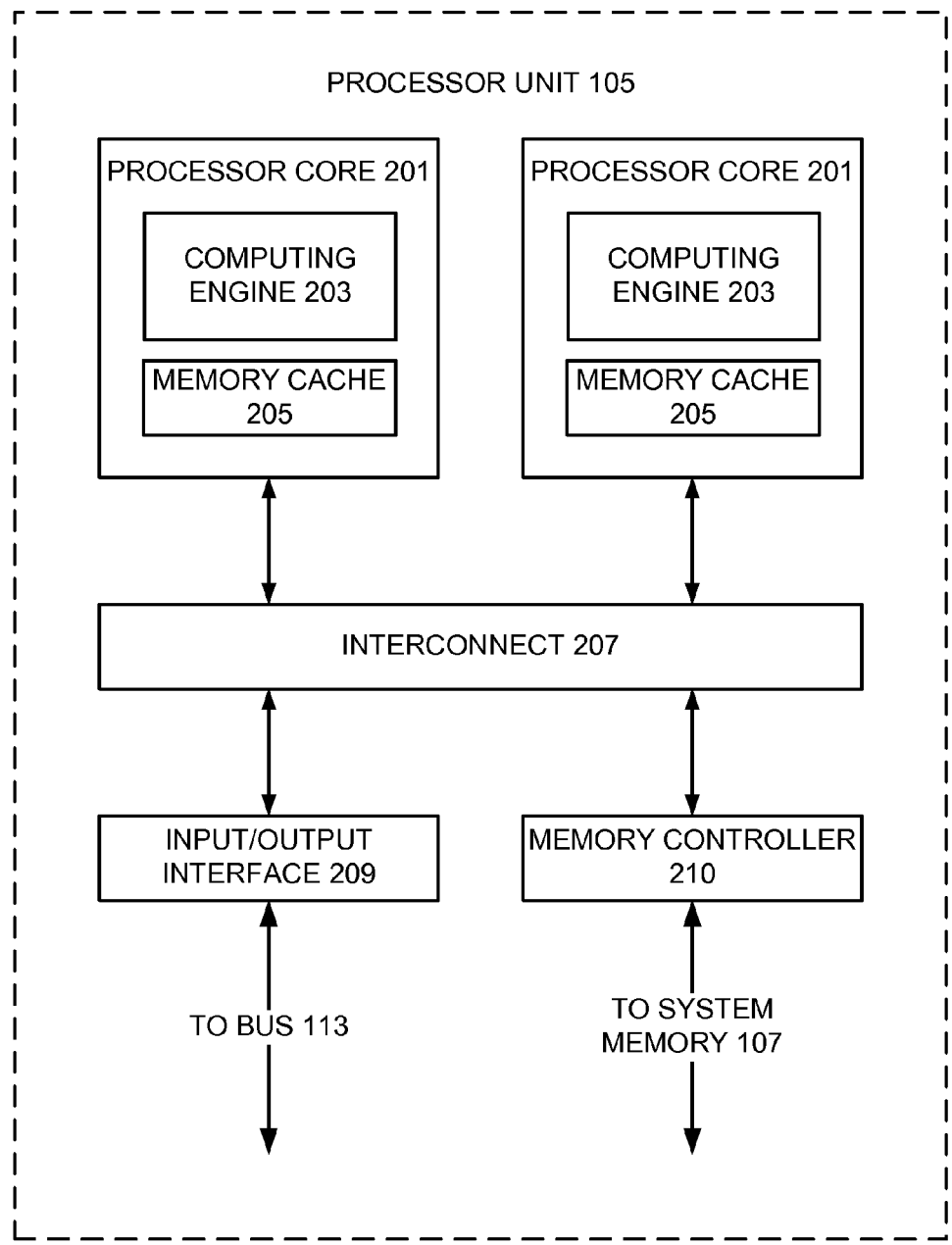

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Hierarchical Layout Fill Implementation

Figure 3:
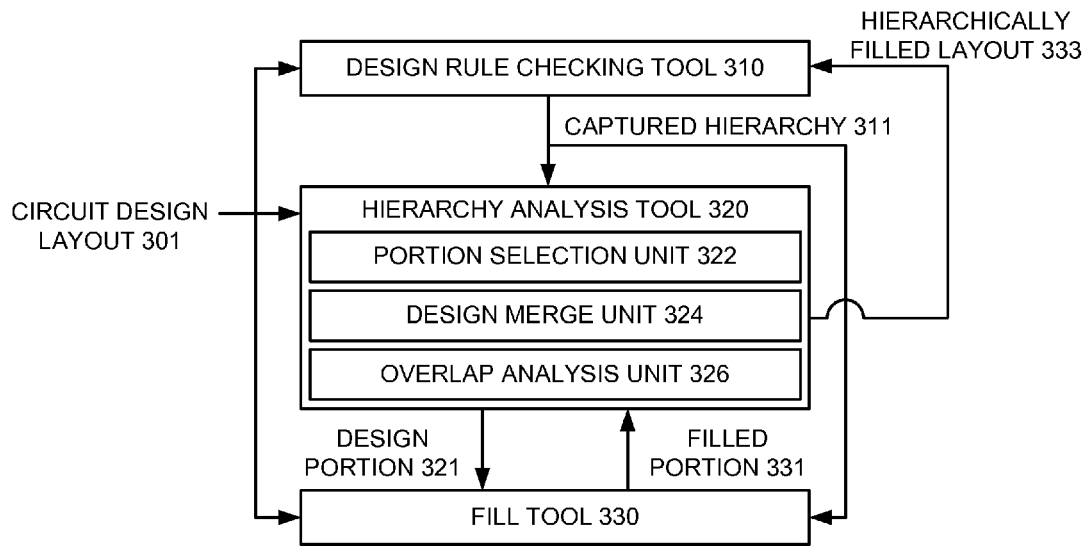
FIG. 3 illustrates an example system to perform hierarchical fill in a circuit design layout that may be implemented according to various embodiments of the invention.
Figure 5:
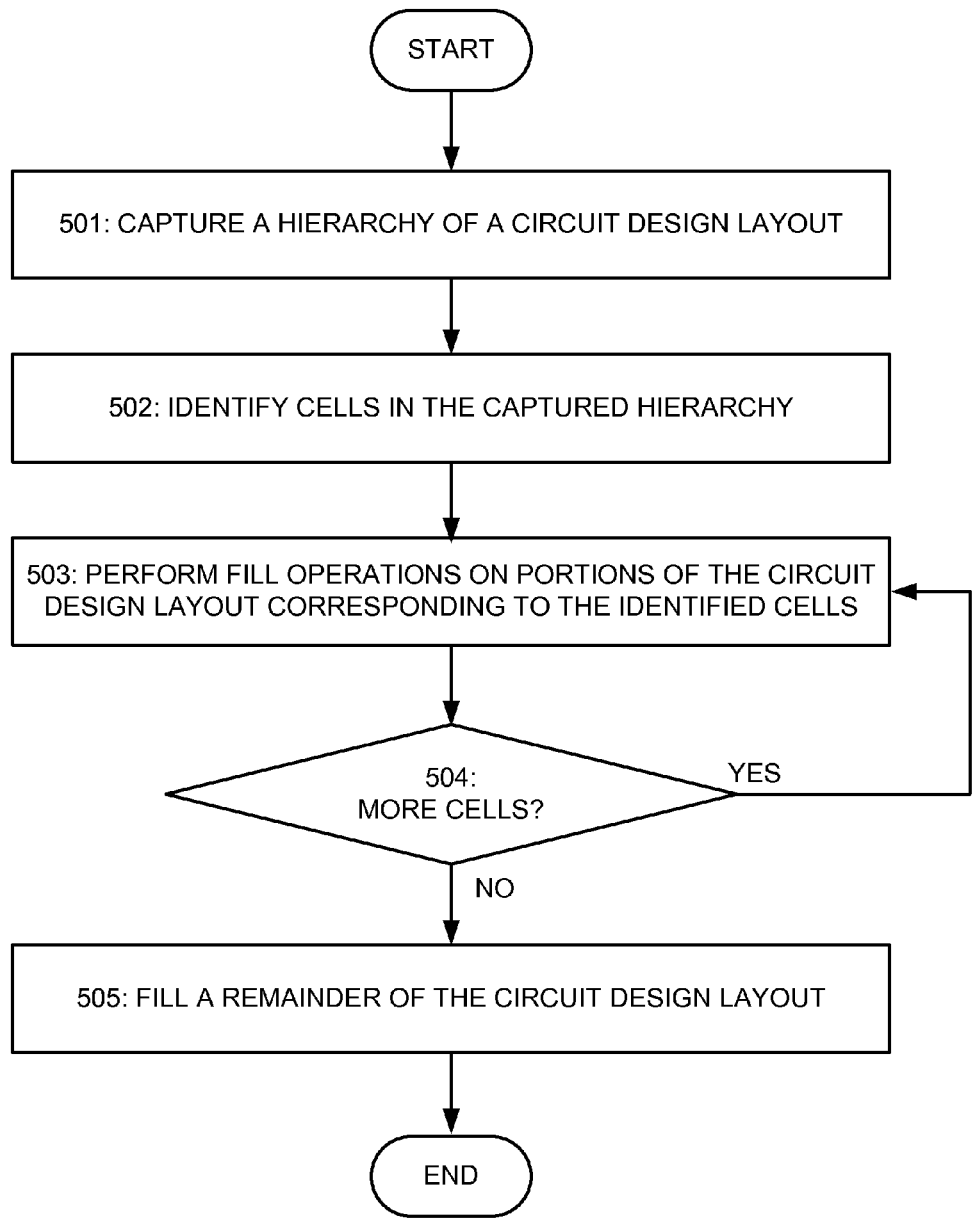
FIG. 5 illustrates a flowchart showing implementation of hierarchical fill for a circuit design layout according to various examples of the invention.

FIG. 3 illustrates an example system to perform hierarchical fill in a circuit design layout 301 that may be implemented according to various embodiments of the invention and FIG. 5 illustrates a flowchart showing implementation of hierarchical fill for the circuit design layout 301 according to various examples of the invention. Referring to FIGS. 3 and 5, the system can include a design rule checking tool 310 to receive a circuit design layout 301, sometimes known as physical design data or "layout" design data, which can describe a physical representation of system, circuit, or other electronic device. The circuit design layout 301 may represent, for example, the geometric elements that can be written onto a mask used to fabricate the desired microcircuit device in a photolithographic process at a foundry. Since in conventional mask or reticle writing tools, geometric elements are polygons of various shapes, the circuit design layout 301 can includes polygon data describing the features of polygons in the design. For example, the initial circuit design layout 301 may include a first set of polygons for creating a photolithographic mask that in turn can be used to form an isolation region of a transistor, a second set of polygons for creating a photolithographic mask that in turn can be used to form a contact electrode for the transistor, and a third set of polygons for creating a photolithographic mask that in turn can be used to form an interconnection line to the contact electrode. The circuit design layout 301 may be in any desired format, such as, for example, the Graphic Data System II (GDSII) data format or the Open Artwork System Interchange Standard (OASIS) data format proposed by Semiconductor Equipment and Materials International (SEMI). Other formats for the circuit design layout 301 may include an open source format named Open Access, Milkyway by Synopsys, Inc., EDDM by Mentor Graphics, Inc, Library Exchange Format/Design Exchange Format (LEF/DEF), or Volcano.

The design rule checking tool 310 can generate a hierarchy for the circuit design layout 301, which can organize or group various portions of the circuit design layout 301 into a hierarchical structure. In some embodiments, this hierarchy can co-locate various design features into common data structures or "cells," which can allow the design rule checking tool 310 to perform design rule checks on a cell-by-cell basis and process cells in parallel. Although the design rule checking tool 310 typically utilizes this hierarchy to internally process the circuit design layout 301, in some embodiments, such as in block 501 of FIG. 5, the hierarchy of the circuit design layout 201 can be captured and outputted from the design rule checking tool 310 as a captured hierarchy 311.

The captured hierarchy 311 can correspond to a skeleton of the circuit design layout 301 defining various hierarchically organized data structures or cells. For example, when the circuit design layout 301 describes a design for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. The design data describing a 128 kB memory array can then be concisely described as a combination of only 64,000 register cells, together with the design data describing its own miscellaneous circuitry, such as an input/output circuit for transferring data into and out of each of the register cells.

Thus, a data structure divided into cells typically will have the cells arranged in a hierarchical manner. The lowest level of cells may include only the basic elements of the data structure. A medium level of cells may then include one or more of the low-level cells, and a higher level of cells may then include one or more of the medium-level cells, and so on. Further, with some data structures, a cell may include one or more lower-level cells in addition to basic elements of the data structure.

By categorizing data into hierarchical cells, large data structures can be processed more quickly and efficiently. For example, the design rule check tool 310 typically will analyze a design to ensure that each circuit feature described in the design complies with specific design rules. With the above example, instead of having to analyze each feature in the entire 128 kB memory array, a design rule check tool 310 can analyze the features in a single bit cell. The results of the check will then be applicable to all of the single bit cells. Once it has confirmed that one instance of the single bit cells complies with the design rules, the design rule check tool 310 can complete the analysis of a register cell by analyzing the features of its miscellaneous circuitry (which may itself be made of up one or more hierarchical cells). The results of this check will then be applicable to all of the register cells. Once it has confirmed that one instance of the register cells complies with the design rules, the design rule check tool 310 can complete the analysis of the entire 128 kB memory array simply by analyzing the features of its miscellaneous circuitry. Thus, the analysis of a large data structure can be compressed into the analyses of a relatively small number of cells making up the circuit design layout 301.

Figure 4:
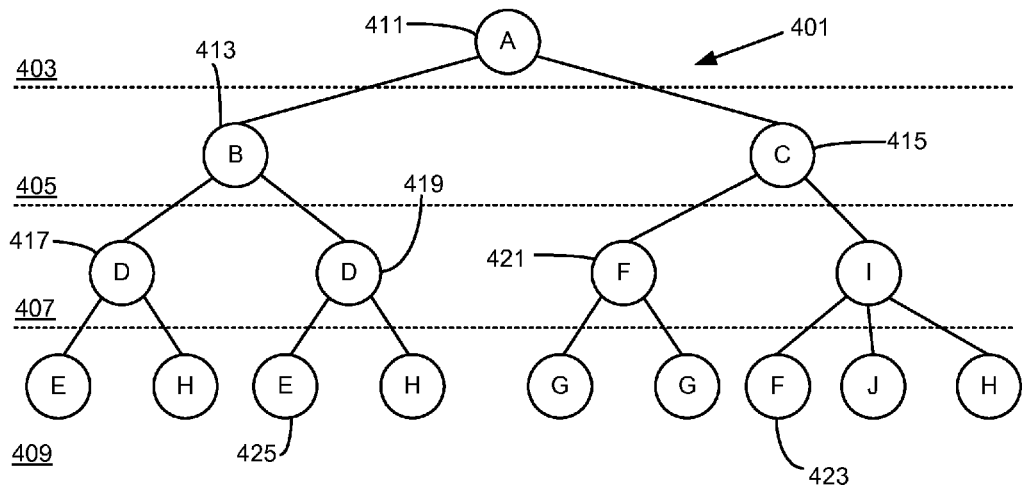
FIG. 4 graphically illustrates an example of design data organized into various hierarchical cells.

FIG. 4 graphically illustrates an example of design data organized into various hierarchical cells. Referring to FIG. 4, design data 401 can be arranged into different cells, indicated by a letter ranging from "A" to "J," each including a portion of the design data. The design data 401 can be divided hierarchically, for example, FIG. 4 shows four hierarchical levels 403-409. The highest level 403 can include a single cell 411, while the second highest level 405 can include multiple cells 413 and 415. As illustrated in this figure, the same cell may occur in multiple hierarchical levels. In some embodiments, data can be repeated for different cells in the hierarchy, for example, cells 421 and 423 can include the same cell data (identified by the letter "F" in the figure), but the cell 421 is in the third hierarchical level 407, while the cell 423 is in the fourth hierarchical level 409. Thus, design data relating to a specific structure, such as a transistor, may be repeatedly used in different hierarchical levels of the process data.

It should be noted that the hierarchy of the cells in the process data may be based upon any desired criteria. For example, with microdevice design data, the hierarchy of the cells may be organized so that cells for larger structures incorporate cells for smaller structures. With other implementations of the invention, however, the hierarchy of the cells may be based upon alternate criteria such as, for example, the stacking order of individual material layers in the microdevice. A portion of the design data for structures that occur in one layer of the microdevice thus may be assigned to a cell in a first hierarchical level. Another portion of the design data corresponding to structures that occur in a higher layer of the microdevice may then be assigned to a cell in a second hierarchical level different from the first hierarchical level.

From the foregoing explanation, it will be apparent that some portions of design data may be dependent upon other portions of the design data. For example, design data for a register cell inherently includes the design data for a single bit memory cell. A hierarchical arrangement of design data also can have independent portions, for example, a cell including design data for a 16 bit comparator can be independent of the register cell. While a "higher" cell may include both a comparator cell and a register cell, where one cell does not include the other cell.

Referring back to FIGS. 3 and 5, the system can include a fill tool 330 to fill the circuit design layout 301 with various fill or dummy structures. Rather than fill the entire circuit design layout 301 at once, however, the system includes a hierarchy analysis tool 320 to utilize the captured hierarchy 311 to select different design portions 321 of the circuit design layout 301 and then order when each of those different design portions 321 are filled by the fill tool 330. The different design portions 321 can have different, but possibly overlapping, areas in the circuit design layout 301, can have different, but possibly overlapping, layers in the circuit design layout 301, or can be different masks for a common layer in the circuit design layout 301. In other words, the hierarchy analysis tool 320 and the fill tool 330 can work in combination to fill the circuit design layout 301, while attempting to retain the design hierarchy present in the captured hierarchy 311 in a hierarchically filled layout 333.

The hierarchy analysis tool 320 can include a portion selection unit 322 to identify different design portions 321 of the circuit design layout 301 from the captured hierarchy 311. For example, in a block 502, a computing system implementing the portion selection unit 322 implemented can identify cells in the captured hierarchy 311, which can correspond to the design portions 321 in the circuit design layout 301 to be filled by the fill tool 330. The hierarchy analysis tool 320 can provide the identified cells and/or the design portions 321 to the fill tool 330, where, in a block 503, the fill tool 330 can perform fill operations on the design portions 321 corresponding to the identified cells.

As will be discussed below in greater detail, in some embodiments, the hierarchy analysis tool 320 also can control an order that cells or portions thereof are filled by the fill tool 330. In some embodiments, the hierarchy analysis tool 320 can utilize an internal hierarchy of the cells to order when certain cells filled relative to other cells. For example, when the circuit design layout 301 includes a memory system having cells corresponding to single bit cells (lower-level cells), register cells (medium-level cells), and a memory system cell (higher-level cell), the hierarchy analysis tool 320 can order when each cells is filled by the fill tool 330 based on this internal hierarchy of cells, i.e., from lower-level to higher-level.

In some embodiments, the hierarchy analysis tool 320 control an order that cells or portions thereof are filled by the fill tool 330 based on cell overlap. The hierarchy analysis tool 320 can include an overlap analysis unit 326 to identify when a cell overlaps another cell the captured hierarchy 311 or overlaps another design feature in the circuit design layout 301. The hierarchy analysis tool 320 can subdivide at least a portion of an overlapped cell and then selectively order when the fill tool 330 fills portions of the circuit design layout 301 associated the subdivided cells. For example, when two cells overlap, the hierarchy analysis tool 320 can prompt the fill tool 330 to fill non-overlapping portions of the two cells separately from an overlapping portion. In another example, when a cell overlaps a design feature located on one physical layer represented by the circuit design layout 301, the hierarchy analysis tool 320 can prompt the fill tool 330 to fill the cell with a physical layer limitation in the overlapping portion of the cell. Embodiments of overlap analysis will be described below in greater detail.

The fill tool 330 can provide the filled design portions 331 to the hierarchical analysis tool 320. The hierarchy analysis tool 320 can include a design merge unit 324 to merge the filled design portions 331 into the captured hierarchy 311, which can ultimately form a hierarchically filled layout 333. In some embodiments, the fill tool 330 can retain the filled design portions 331 of the circuit design layout 301, rather than provide them to the hierarchy analysis tool 320, and utilize them to generate the hierarchically filled layout 333.

In a decision block 504, the hierarchy analysis tool 320 can determine whether there are additional cells to fill, for example, based on the identification of cells by the portion selection unit 322. When the hierarchy analysis tool 320 determines that there are more cells to fill, execution can return to block 503 to perform fill operation on the portions of the circuit design layout 301 corresponding to the additional cells. Otherwise, execution continues to a block 505, where the hierarchy analysis tool 320 can prompt the fill tool 330 to perform fill operations on a remainder of the circuit design layout 301, e.g., those portions of the circuit design layout 301 not associated in a cell in the captured hierarchy 311 or otherwise left unfilled after the execution of block 503. The fill tool 330 can provide the filled remainder of the circuit design layout 301 to the hierarchy analysis tool 320 as another filled design portion 331, where the design merge unit 324 can merge the filled design portion 331 into the captured hierarchy 311 forming the hierarchically filled layout 333.

In some embodiments, the design rule checking tool 310 can be replaced by a different downstream tool, such as an optical proximity correction tool, which can perform check, verification, or other layout modification operations on the circuit design layout 301. In some embodiments, the fill tool 300 can be replaced by a different circuit design layout modification tool, such as a via incorporation tool, a wire modification tool, or the like, which can perform hierarchical layout modification operations on the circuit design layout 301. As noted above, various embodiments of the invention may be implemented by the execution of software instructions with a programmable computer or computing system. For example, some embodiments of the invention may be implemented using the CALIBRE® software tools available from Mentor Graphics® Corporation of Wilsonville, Oreg. It should be appreciated, however, that other software tools for identifying and manipulating data in a circuit design layout may alternately or additionally be used to implement various examples of the invention. Further, a user may employ separate software tools in combination to implement various aspects of the invention. For example, a user may employ one or more software tools, such as the CALIBRE® software tools, to identify fill regions in a circuit design layout, and then use one or more other software tools, such as proprietary software tools, or other tools available from Mentor Graphics® Corporation or other tool vendors, to add fill structures to those fill regions.

Internal Hierarchy in a Hierarchical Fill Implementation

Figure 6:
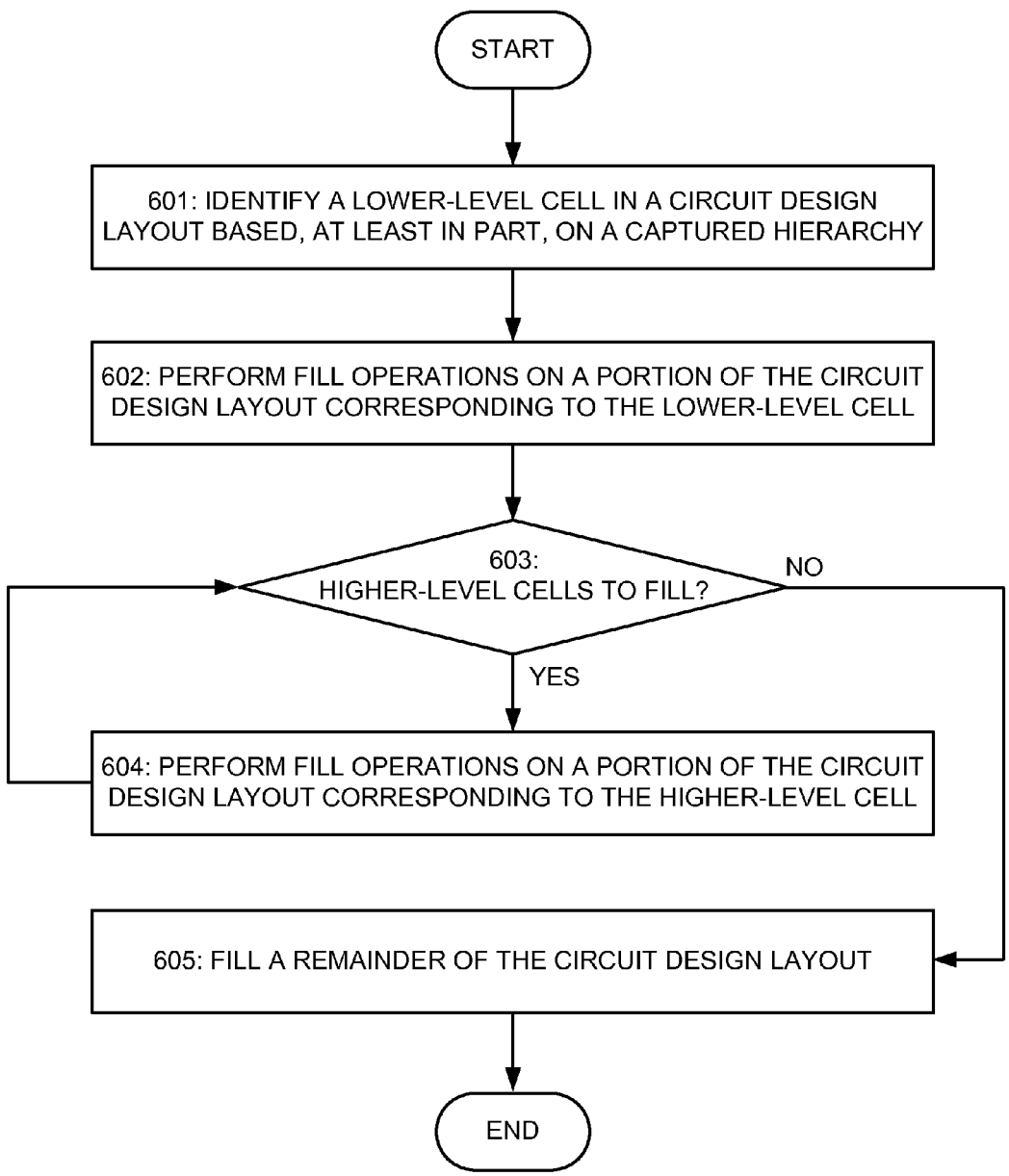
FIG. 6 illustrates an example of internal hierarchy in a hierarchical fill implementation according to various embodiments of the invention.

FIG. 6 illustrates an example of internal hierarchy in a hierarchical fill implementation according to various embodiments of the invention. Referring to FIG. 6, in a block 601, a computing system can identify a lower-level cell in a circuit design layout based, at least in part, on a captured hierarchy for the circuit design layout. As discussed above, the captured hierarchy for the circuit design layout can include multiple hierarchically organized or arranged cells corresponding to different portions of the circuit design layout. The computing system can analyze the hierarchical organization of the cells to identify the lower-level cells in the circuit design layout.

In a block 602, the computing system can perform fill operations on a portion of the circuit design layout corresponding to the lower-level cell. For example, the computing system can implement a fill tool, which can perform fill operations on the portion of the circuit design layout corresponding to the lower-level cell. In some embodiments, the fill tool can receive the circuit design layout and selectively fill the portion of the circuit design layout corresponding to the lower-level cell. While, in other embodiments, the fill tool can receive the portion of the circuit design layout corresponding to the lower-level cell, which it can fill.

In a decision block 603, the computing system can determine whether there are higher-level cells to fill associated with the lower-level cell in the captured hierarchy. Similarly to the identification of a lower-level cell in the captured hierarchy, the computing system can analyze the hierarchical organization of the cells to identify higher-level cells associated with the lower-level cell in the captured hierarchy. When the computing system determines that there are higher-level cells to fill associated with the lower-level cell in the captured hierarchy, execution continues to a block 604, where the computing system can perform fill operations on a portion of the circuit design layout corresponding to the higher-level cell. In some embodiments, the fill tool can receive the circuit design layout and selectively fill the portion of the circuit design layout corresponding to the higher-level cell. While, in other embodiments, the fill tool can receive the portion of the circuit design layout corresponding to the higher-level cell, which it can fill.

When, in block 603, the computing system determines that there are not higher-level cells to fill associated with the lower-level cell in the captured hierarchy, execution continues to a block 605, where the computing system can fill a remainder of the circuit design layout, e.g., those portions of the circuit design layout not associated in a cell in the captured hierarchy or otherwise left unfilled after the execution of blocks 602 and 604.

Overlap Analysis in a Hierarchical Fill Implementation

Figure 7:
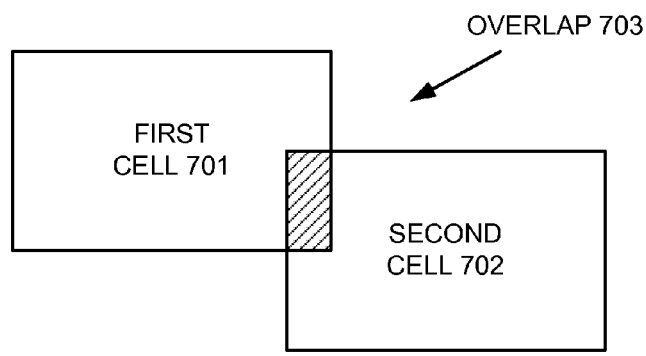
FIG. 7 illustrates an example cell-to-cell overlap in a captured hierarchy of a circuit design layout according to various examples of the invention.

FIG. 7 illustrates an example cell-to-cell overlap in a captured hierarchy of a circuit design layout according to various examples of the invention and Referring to FIG. 7, a captured hierarchy of a circuit design layout can include a group of cells, two of which can overlap. For example, the group of cells can include a first cell 701, which at least partially overlaps a second cell 702. In some embodiments, the area of overlap 703 between the first cell 701 and the second cell 702 can be represented as a two-dimensional area, for example, relative to the surface area of a circuit design layout. The overlap between two cells also can be represented as a three-dimensional volume, which can take into account surface area relative to the circuit design layout as well as layer overlap.

Figure 8:
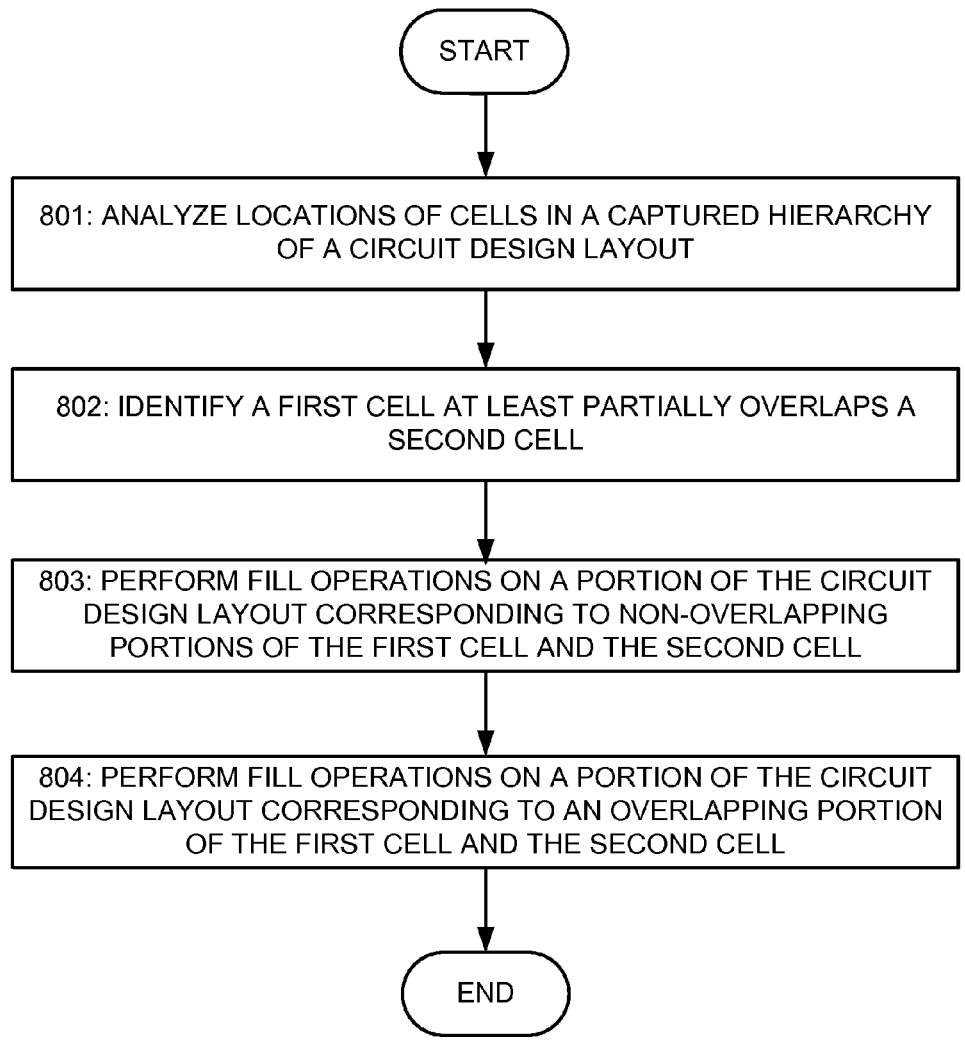
FIG. 8 illustrates an example flowchart showing overlap analysis with a cell-to-cell overlap according to various examples of the invention.

FIG. 8 illustrates an example flowchart showing overlap analysis with a cell-to-cell overlap according to various examples of the invention. Referring to FIG. 8, in a block 801, a computing system can analyze locations of cells in a captured hierarchy of a circuit design layout, which, in a block 802, can identify a first cell at least partially overlaps a second cell. As discussed above, the computing system can determine the first cell at least partially overlaps the second cell when the first and second cell share a common surface area of the circuit design layout, include common design components, structures, or features, or the like.

The computing system can perform fill operations on a portion of the circuit design layout corresponding to non-overlapping portions of the first cell and the second cell in block 803, and corresponding to an overlapping portion of the first cell and the second cell, in a block 804. The computing system can perform these fill operations in any sequence or order. In some embodiments, the computing system may elect to perform fill operations on the overlapping portions corresponding to the first cell and the second cell, and then performing fill operations on the now partially filled first cell and now partially filled second cell. By separately filling the overlapping and non-overlapping portions corresponding to the first cell and the second cell, the computing system can ensure that fill structures added to an overlapping portion corresponding to the first cell does not inadvertently affect design structures corresponding to the overlapping portion in the second cell.

Figure 9:
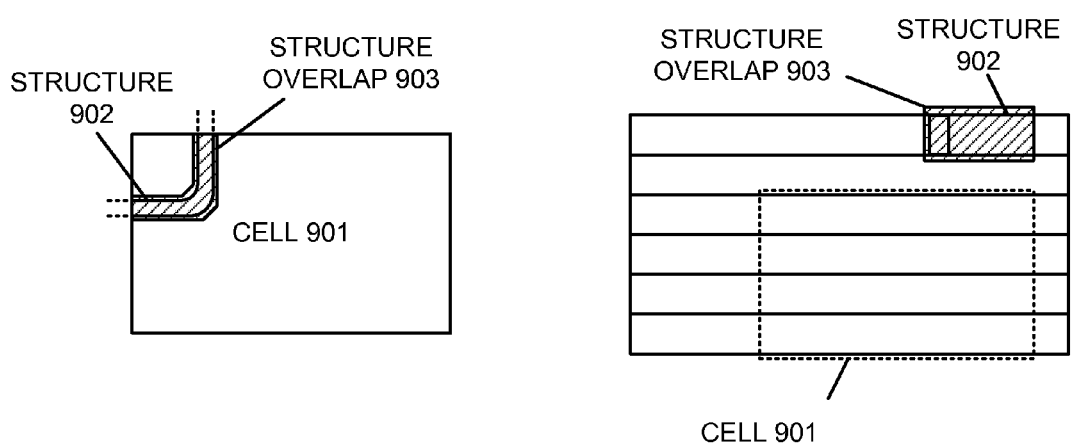
FIG. 9 illustrates an example cell-to-structure overlap according to various examples of the invention.

FIG. 9 illustrates an example cell-to-structure overlap according to various examples of the invention. Referring to FIG. 9, a captured hierarchy of a circuit design layout can include at least one cell 901, which can overlap with a design structure 902 in the circuit design layout. As an example, FIG. 9 shows the cell 901 at least partially overlap a top level routing metal, but other overlap with different design structures are possible. In some embodiments, the area of structure overlap 903 between the cell 901 and the design structure 902 can be represented in three-dimensions. The overlap between the cell 901 and the design structure 902 can be represented as a surface area relative to the circuit design layout as well as layer overlap.

Figure 10:
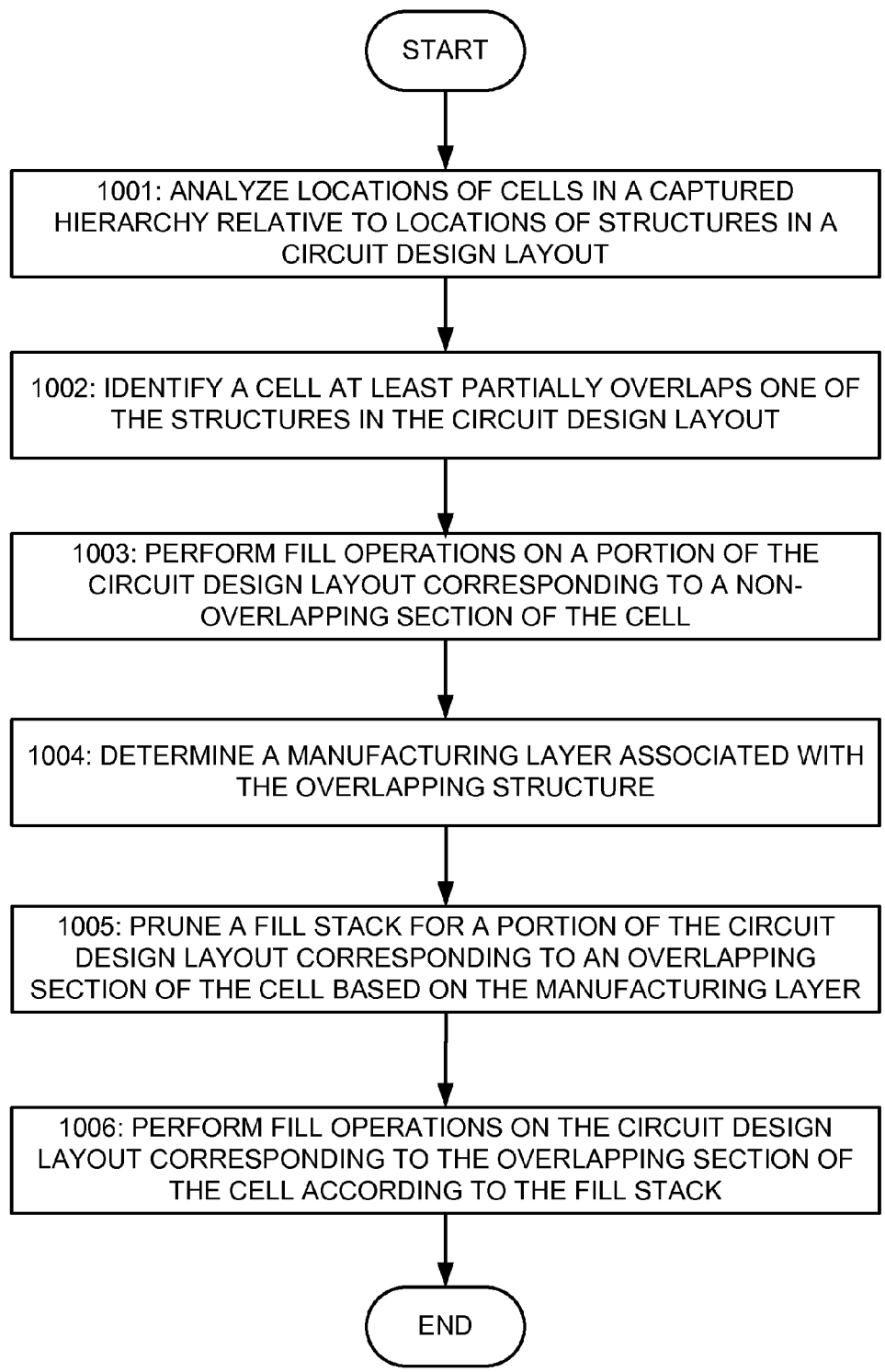
FIG. 10 illustrates an example flowchart showing overlap analysis implementing fill stack pruning according to various examples of the invention.

FIG. 10 illustrates an example flowchart showing overlap analysis implementing fill stack pruning according to various examples of the invention. Referring to FIG. 10, in a block 1001, a computing system can analyze locations of cells in a captured hierarchy relative to locations of structures in a circuit design layout, which, in a block 1002, can identify a cell at least partially overlaps one of the structures in the circuit design layout. As discussed above, the computing system can determine the cell at least partially overlaps the design structure when the cell and the design structure share a common surface area or layer in the circuit design layout.

In a block 1003, the computing system can perform fill operations on a portion of the circuit design layout corresponding to a non-overlapping section of the cell. Since fill operations typically fill an entire stack or all layers of the circuit design layout, since the non-overlapping sections of the cell do not have conflicting design structures, the computing system can perform fill operations on the entire stack.

The computing system, in a block 1004, can determine a manufacturing layer associated with the overlapping structure, and, in a block 1005, can prune a fill stack for a portion of the circuit design layout corresponding to an overlapping section of the cell based on the manufacturing layer. In some embodiments, the computing system can remove higher-level layers from the fill stack for the overlapping section of the cell based on the manufacturing layer of the design structure 902.

In a block 1006, the computing system can perform fill operations on the circuit design layout corresponding to the overlapping section of the cell according to the pruned fill stack. By pruning the fill stack and partially filling circuit design layout corresponding to the cell in areas that overlap with a design structure, the filled cell can remain similar to other redundant cells in the circuit design layout, which can ease subsequent downstream processing and analysis.

The system and apparatus described above may use dedicated processor systems, micro controllers, programmable logic devices, microprocessors, or any combination thereof, to perform some or all of the operations described herein. Some of the operations described above may be implemented in software and other operations may be implemented in hardware. Any of the operations, processes, and/or methods described herein may be performed by an apparatus, a device, and/or a system substantially similar to those as described herein and with reference to the illustrated figures.

The processing device may execute instructions or "code" stored in memory. The memory may store data as well. The processing device may include, but may not be limited to, an analog processor, a digital processor, a microprocessor, a multi-core processor, a processor array, a network processor, or the like. The processing device may be part of an integrated control system or system manager, or may be provided as a portable electronic device configured to interface with a networked system either locally or remotely via wireless transmission.

The processor memory may be integrated together with the processing device, for example RAM or FLASH memory disposed within an integrated circuit microprocessor or the like. In other examples, the memory may comprise an independent device, such as an external disk drive, a storage array, a portable FLASH key fob, or the like. The memory and processing device may be operatively coupled together, or in communication with each other, for example by an I/O port, a network connection, or the like, and the processing device may read a file stored on the memory. Associated memory may be "read only" by design (ROM) by virtue of permission settings, or not. Other examples of memory may include, but may not be limited to, WORM, EPROM, EEPROM, FLASH, or the like which may be implemented in solid state semiconductor devices. Other memories may comprise moving parts, such as a known rotating disk drive. All such memories may be "machine-readable" and may be readable by a processing device.

Operating instructions or commands may be implemented or embodied in tangible forms of stored computer software (also known as "computer program" or "code"). Programs, or code, may be stored in a digital memory and may be read by the processing device. "Computer-readable storage medium" (or alternatively, "machine-readable storage medium") may include all of the foregoing types of memory, as well as new technologies of the future, as long as the memory may be capable of storing digital information in the nature of a computer program or other data, at least temporarily, and as long at the stored information may be "read" by an appropriate processing device. The term "computer-readable" may not be limited to the historical usage of "computer" to imply a complete mainframe, mini-computer, desktop or even laptop computer. Rather, "computer-readable" may comprise storage medium that may be readable by a processor, a processing device, or any computing system. Such media may be any available media that may be locally and/or remotely accessible by a computer or a processor, and may include volatile and non-volatile media, and removable and non-removable media, or any combination thereof.

A program stored in a computer-readable storage medium may comprise a computer program product. For example, a storage medium may be used as a convenient means to store or transport a computer program. For the sake of convenience, the operations may be described as various interconnected or coupled functional blocks or diagrams. However, there may be cases where these functional blocks or diagrams may be equivalently aggregated into a single logic device, program or operation with unclear boundaries.

CONCLUSION

While the application describes specific examples of carrying out embodiments of the invention, those skilled in the art will appreciate that there are numerous variations and permutations of the above described systems and techniques that fall within the spirit and scope of the invention as set forth in the appended claims. For example, while specific terminology has been employed above to refer to design processes, it should be appreciated that various examples of the invention may be implemented using any desired combination of electronic design automation processes.

One of skill in the art will also recognize that the concepts taught herein can be tailored to a particular application in many other ways. In particular, those skilled in the art will recognize that the illustrated examples are but one of many alternative implementations that will become apparent upon reading this disclosure.

Although the specification may refer to "an", "one", "another", or "some" example(s) in several locations, this does not necessarily mean that each such reference is to the same example(s), or that the feature only applies to a single example.

The invention claimed is:

1. A method comprising:
receiving, by a computing system, a circuit design layout and a captured hierarchy of the circuit design layout, wherein the captured hierarchy was generated by a downstream design rule check tool, and wherein the captured hierarchy categorizes design data in the circuit design layout into multiple cells having a hierarchical organization;
identifying, by the computing system, multiple portions of the circuit design layout from the cells in the captured hierarchy; and modifying, by the computing system, the circuit design layout by performing separate fill operations on the portions of the circuit design layout identified from the cells in the captured hierarchy, wherein the fill operations add fill structures to the portions of the circuit design layout, wherein the downstream design rule check tool performs design rule checking operations after the modification of the circuit design layout with the addition of the fill structures.

2. The method of claim 1, wherein the modified circuit design layout has a hierarchy substantially similar to the captured hierarchy of the circuit design layout.

3. The method of claim 1, wherein modifying the circuit design layout further comprises merging the portions of the circuit design layout added with the fill structures into the captured hierarchy.

4. The method of claim 3, wherein performing fill operations on the portions of the circuit design layout identified by the cells further comprises:
   identifying a hierarchical level for each of the cells in the captured hierarchy; and
   performing separate fill operations on the portions of the circuit design layout identified from the cells in the captured hierarchy based, at least in part, on the identified hierarchical level of the cells in the captured hierarchy.

5. The method of claim 1, further comprising analyzing, by the computing system, the captured hierarchy to identify overlap between a first cell and a second cell in the captured hierarchy, wherein modifying the circuit design layout includes modifying the circuit design layout corresponding to the first cell based on the identified overlap between the first cell and the second cell in the captured hierarchy.

6. The method of claim 1, further comprising analyzing, by the computing system, the captured hierarchy to identify overlap between one of the cells in the captured hierarchy and a structure on a first layer of the circuit design layout, wherein modifying the circuit design layout includes pruning a fill stack for the cell based on the overlap with the structure and modifying a second layer of the circuit design layout that corresponds to the identified cell according to the pruned fill stack.

7. A system comprising:
   a memory system configured to store computer-executable instructions; and
   a computing system, in response to execution of the computer-executable instructions, is configured to:
      receive a circuit design layout and a captured hierarchy of the circuit design layout, wherein the captured hierarchy was generated by a downstream design rule check tool, and wherein the captured hierarchy categorizes design data in the circuit design layout into multiple cells having a hierarchical organization;
      identify multiple portions of the circuit design layout from the cells in the captured hierarchy; and
      modify the circuit design layout by performing separate fill operations on the portions of the circuit design layout identified from the cells in the captured hierarchy, wherein the fill operations add fill structures to the portions of the circuit design layout, wherein the downstream design rule check tool performs design rule checking operations after the modification of the circuit design layout with the addition of the fill structures.

8. The system of claim 7, wherein the modified circuit design layout has a hierarchy substantially similar to the captured hierarchy of the circuit design layout.

9. The system of claim 7, wherein the computing system, in response to execution of the computer-executable instructions, is further configured to merge the portions of the circuit design layout added with the fill structures into the captured hierarchy.

10. The system of claim 9, wherein the computing system, in response to execution of the computer-executable instructions, is further configured to:
    identify a hierarchical level for each of the cells in the captured hierarchy; and
    perform separate fill operations on the portions of the circuit design layout identified from the cells in the captured hierarchy based, at least in part, on the identified hierarchical level of the cells in the captured hierarchy.

11. The system of claim 7, wherein the computing system, in response to execution of the computer-executable instructions, is further configured to:
    analyze the captured hierarchy to identify overlap between a first cell and a second cell in the captured hierarchy; and
    modify the circuit design layout corresponding to the first cell based on the identified overlap between the first cell and the second cell in the captured hierarchy.

12. The system of claim 7, wherein the computing system, in response to execution of the computer-executable instructions, is further configured to:
    analyze the captured hierarchy to identify overlap between one of the cells in the captured hierarchy and a structure on a first layer of the circuit design layout;
    prune a fill stack for the cell based on the overlap with the structure; and
    modify a second layer of the circuit design layout that corresponds to the identified cell according to the pruned fill stack.

13. An apparatus comprising at least one computer-readable memory device storing instructions configured to cause one or more processing devices to perform operations comprising:
    receiving a circuit design layout and a captured hierarchy of the circuit design layout, wherein the captured hierarchy was generated by a downstream design rule check tool, and wherein the captured hierarchy categorizes design data in the circuit design layout into multiple cells having a hierarchical organization;
    identifying multiple portions of the circuit design layout from the cells in the captured hierarchy; and
    modifying the circuit design layout by performing separate fill operations on the portions of the circuit design layout identified from the cells in the captured hierarchy, wherein the fill operations add fill structures to the portions of the circuit design layout, wherein the downstream design rule check tool performs design rule checking operations after the modification of the circuit design layout with the addition of the fill structures.

14. The apparatus of claim 13, wherein the modified circuit design layout has a hierarchy substantially similar to the captured hierarchy of the circuit design layout.

15. The apparatus of claim 13, wherein the instructions are configured to cause one or more processing devices to perform operations further comprising: merging the portions of the circuit design layout added with the fill structures into the captured hierarchy.

16. The apparatus of claim 15, wherein the instructions are configured to cause one or more processing devices to perform operations further comprising:
- identifying a hierarchical level for each of the cells in the captured hierarchy; and
- performing separate fill operations on the portions of the circuit design layout identified from the cells in the captured hierarchy based, at least in part, on the identified hierarchical level of the cells in the captured hierarchy.

17. The apparatus of claim 13, wherein the instructions are configured to cause one or more processing devices to perform operations further comprising:
- analyzing the captured hierarchy to identify overlap between a first cell and a second cell in the captured hierarchy; and
- modifying the circuit design layout corresponding to the first cell based on the identified overlap between the first cell and the second cell in the captured hierarchy.

18. The apparatus of claim 13, wherein the instructions are configured to cause one or more processing devices to perform operations further comprising:
- analyzing the captured hierarchy to identify overlap between one of the cells in the captured hierarchy and a structure on a first layer of the circuit design layout;
- pruning a fill stack for the cell based on the overlap with the structure; and
- modifying a second layer of the circuit design layout that corresponds to the identified cell according to the pruned fill stack.

* * * * *